United States Patent [19]

Simison

[11] Patent Number: 4,686,640

[45] Date of Patent: Aug. 11, 1987

[54] PROGRAMMABLE DIGITAL HYSTERESIS CIRCUIT

[75] Inventor: Paul C. Simison, Phoenix, Ariz.

[73] Assignee: Honeywell Inc., Minneapolis, Minn.

[21] Appl. No.: 680,860

[22] Filed: Dec. 12, 1984

[51] Int. Cl.$^4$ .............................................. H04N 5/21
[52] U.S. Cl. ................................ 364/571; 358/213.15
[58] Field of Search ............... 364/571, 573, 574, 579; 358/213

[56] References Cited

U.S. PATENT DOCUMENTS

| | | | |
|---|---|---|---|
| 4,254,469 | 3/1981 | Whitely | 364/571 |
| 4,412,299 | 10/1983 | Huffman | 364/571 X |
| 4,499,547 | 2/1985 | Inuiya et al. | 364/571 |

Primary Examiner—Errol A. Krass
Assistant Examiner—H. R. Herndon
Attorney, Agent, or Firm—Arnold L. Albin

[57] ABSTRACT

A digital hysteresis circuit which generates a stable signal for driving a digital readout indicator from an analog signal indicative of the position of a mechanical driving device having noise signal components leading to erratic indications superposed thereon.

A reference signal generated by an up-down counter is compared with the digitized input signal in a memory store. Only when the difference in the compared digital values exceeds a predetermined digital hysteresis value in the memory store corresponding to the allowable noise signals is a command signal generated to increment or decrement the counter so as to reduce the difference in digital value. The reference signal is applied to drive the digital readout indicator, thereby precluding unstable indications due to noise, jitter, and system threshold uncertainty.

10 Claims, 5 Drawing Figures

PROGRAMMABLE DIGITAL HYSTERESIS CIRCUIT

BACKGROUND OF THE INVENTION

1. Field of the Invention

This invention relates generally to digitized alpha numeric displays and more particularly to a means for reducing instability in the readout of a binary digital signal subject to errors from noise, jitter, or threshold uncertainty superposed thereon.

2. Description of the Prior Art

The present invention is adapted for use with an on-board aircraft radar antenna system. The system includes a mechanical drive for redirecting the antenna to a desired position.

In this application, the drive system is controlled by a digital circuit which includes a potentiometer having a control knob located at a control panel in the aircraft cockpit. Rotation of the control knob generates a digital command signal which causes the drive system to rotate the antenna to a position dependent on the amplitude and direction of rotation of the control knob. A digital readout indicator located in the cockpit is coupled to receive the digital command signal which reflects the antenna position as the control knob is rotated.

Preferably, on the completion of rotation of the control knob, the sequential progression of numerals on the readout indicator will come to rest at a finite value, thereby indicating the present position of the antenna. However, in practice, due to noise, jitter, or threshold uncertainty signal components superposed on the analog position signal, the progression of numerals on the readout indicator cotinues to fluctuate, that is, move erratically from one number to another, leading to uncertainty as to the actual position of the antenna.

Noise may be defined as a random or periodic disturbance superposed upon the useful signal tending to obscure its information content. Such noise may be produced, for example, by thermal agitation in electronic circuit components or by coupling from adjacent circuits, such as switching power supplies and other pulse sources. Jitter refers to the small, rapid aberrations in the indicated signal which are time, amplitude, frequency, or phase related, and which may result, for example, from the wiping action of a movable contact on the control knob. Threshold uncertainty results from the condition where the control knob is left in a transition position such that is at the threshold of producing a change in digital values, and hence the digital readout does not have a unique input signal.

The prior art has attempted to solve the problem of unstable indication by such techniques as high-grade smoothing filters, or dedigitization of the digital signal with positive feedback. While these approaches have to some extent mitigated the problems associated with noise or jitter or threshold digital uncertainty, none have solved the problems associated with the occurrence of all three conditions simultaneously.

High-grade smoothing refers to the use of a filter circuit, which may comprise a network of resistors and capacitors which are coupled to the analog signal to be processed, thereby removing selectively a broad band of undesired frequency components which contribute to noise and jitter. However, this technique can result in a noticable delay between rotation of the control knob and the resultant display due to phase shift in the network, and does not prevent the signal from being adjusted close to a digital threshold which will cause uncertainty.

The use of dedigitizing and positive feedback is a technique in which an analog signal from the position control is converted to digital form by means of an analog/digital convertor for transmission. The digitized signal is then reconverted to analog form by means of a digital/analog converter. A small fraction of the recovered analog signal is summed with the analog signal from the position control to provide feedback to the analog/digital converter. This approach is effective in reducing threshold uncertainty, but is limited to less than one bit of authority, since positive feedback may permit circuit oscillation.

A further technique that has been suggested is the elimination of low order bits, which effectively disables the system response to small changes. However, this results in an undesirable loss of sensitivity to the operator, since the readout appears to progress in quantum steps such as 2.0, 2.3, 2.6,. etc., rather than the smaller increments with which the control knob may be capable of being adjusted and which the operator will expect to observe.

SUMMARY OF THE INVENTION

More particularly, the present invention relates to stabilizing the numerical indication of the position of a selectively moveable on-board aircraft radar antenna which otherwise provides an erratic output which is not indicative of the true position of the antenna by generating a stable reference digital signal for driving the antenna and the indicator, and varying the reference signal in accordance with predetermined digital values stored in a digital memory comparator, whereby a command signal is generated to correct the reference digital signal in a direction so as to reduce differences between the value of the unstable input signal and the reference digital signal when the differences exceed an error or hysteresis zone corresponding to predetermined values stored in the memory.

The invention disclosed herein overcomes the foregoing problems by providing a digital circuit for converting a binary digital signal encumbered by noise, jitter and threshold uncertainty into a controlled, smoothly varying digital output data signal by applying digital hysteresis to the positional signal. The hysteresis values and error correction values are embodied in a programmable addressable memory.

A digital control apparatus for reducing instability in the readout of a digital input signal by interposing a predetermined value of hysteresis comprises a data output generator in the form of an up-down counter to generate a stable reference digital output signal which is applied to energize the digital display. The digital input signal and the reference digital output signal are applied to a digital data store in the form of a programmable read only memory apportioned to respond to groups of high order and lower order bits. Correction factors in the form of binary words stored in the memory are addressed by the apportioned signals and applied to increment or decrement the up-down counter. The counter is thus adjusted to minimize differences in the values of the data input and output signals and bring the value of the reference signal into concurrence with the input binary digital signal, but since the reference signal does not respond to the noise, jitter, and control threshold uncertainty, tends to smooth and stabilize the output display. The hysteresis zone provided by the programmable memory inhibits the system from responding to small deviations in the input binary signal within a predetermined range of values.

These and other features of the present invention will become apparent from the following description of a preferred embodiment of the invention as illustrated in the accompanying drawings.

BRIEF DESCRIPTION OF THE DRAWINGS

FIG. 4 shows in tabular form the decimal equivalents of the binary words stored in PROM $U_4$ of FIG. 1 with a six-bit address.

FIG. 5 shows in tabular form the decimal equivalents of the binary words stored in PROM $U_4$ with an enhanced nine-bit address.

DESCRIPTION OF THE PREFERRED EMBODIMENT

In general terms, the invention comprises apparatus for providing digital hysteresis to a noisy digital signal for stabilizing the output of an alphanumeric display. The hysteresis values are stored in a digital memory which is addressed by the input digital signal in binary form and by a reference digital signal. The values stored in the memory are representative of predetermined differences in values of the input and reference digital signals. The reference signal value is incremented or decremented according to the values addressed to agree with the input signal and is used to energize the alphanumeric display. Changes in the alphanumeric display are inhibited until the difference values exceed a predetermined change, defined as the hysteresis. Thus, perturbations in the digital readout are minimized to values which are not apparent to the operator.

Figure 1:
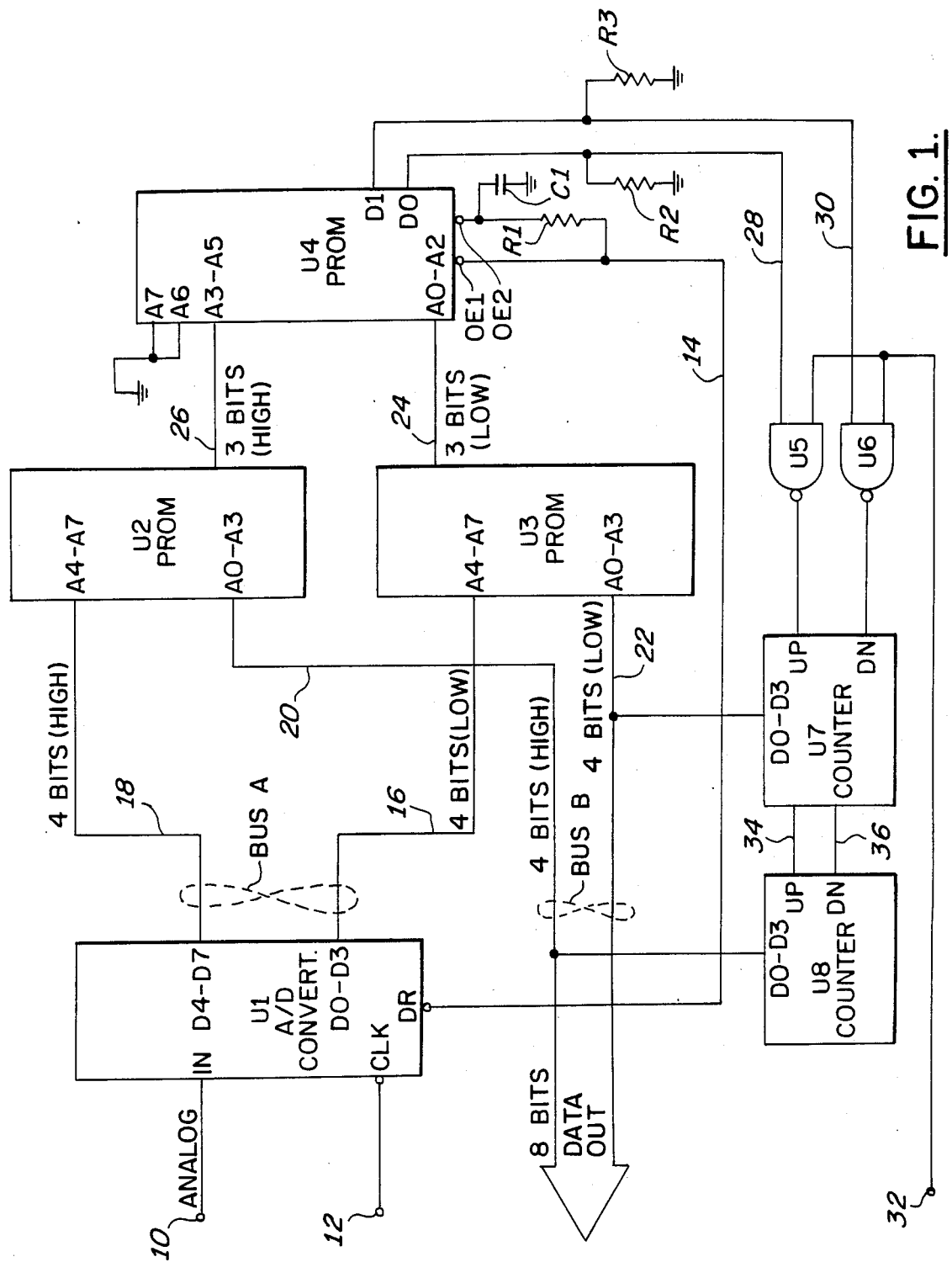
FIG. 1 is a schematic block diagram of a digital hysteresis readout system implemented in accordance with the the invention.

Referring to FIG. 1 a schematic block of the system is illustrated. An input signal 10 which may be an analog signal derived from a controler transducer is applied to an analog/digital converter $U_1$. Converter $U_1$ forms no part of the present invention and is of a conventional type which samples and digitizes an input analog signal in synchronism with a clock pulse. It is shown here for clarity in illustrating the interface of the invention. Typically, a clock signal 12 at a frequency of approximately 100 Hz will be applied to converter $U_1$. $U_1$ also provides a Data Ready output signal at terminal DR to enable PROM $U_4$ when the conversion process has been completed and to signal that the data has settled and is ready for a transfer to the readout circuitry. The Data Ready signal is coupled to PROM $U_4$ via line 14 and controlled by the conversion clock at 12. Converter $U_1$ generates an eight-bit data word which is organized into a low order four-bit field and a high order four-bit field, shown coupled to PROMs $U_3$ and $U_2$ on buses 16 and 18, respectively. Bus 18 provides the high order bits to address $A_4$-$A_7$ of PROM $U_2$, while bus 16 provides the low order bits to address $A_4$-$A_7$ of PROM $U_3$.

An up/down counter comprised of cascaded counters $U_7$, $U_8$ generates a digital reference signal which serves as the data output signal of the digital hysteresis circuit. The reference signal is comprised of an eight-bit word having a low order four-bit field derived from counter $U_7$ and a high order four-bit field derived from counter $U_8$. The digital reference signal is also connected to address PROMs $U_2$ and $U_3$ with bus 20 providing the high order bits to address $A_0$-$A_3$ of PROM $U_2$ and bus 22 providing the low order bits to address $A_0$-$A_3$ of PROM $U_3$.

PROMS $U_2$ and $U_3$ compare the digitized values of the signals on buses 16, 18, 20, and 22 and generate output signals which are received by a further PROM $U_4$. As in the preceeding circuitry, the high and low order bits are organized into two fields, the low order field being derived from PROM $U_3$ and coupled on line 24, while the high order field is derived from PROM $U_2$ and coupled on line 26. Lines 24 and 26 combine to provide a six-bit address $A_0$-$A_2$ and $A_3$-$A_5$. PROM $U_4$ in turn generates command signals to increment counter $U_7$, $U_8$ up or down so as to increment or decrement the reference signals on lines 20 and 22 in a direction which will reduce differences with the input signals on lines 16 and 18 in accordance with the hysteresis programmed into PROM $U_2$, $U_3$ and $U_4$. The command signals are coupled on lines 28 and 30 to corresponding NAND gates $U_5$ and $U_6$. Resistors $R_2$ and $R_3$, coupled respectively to the command lines and ground, ensure that PROM $U_4$ outputs are low when PROM $U_4$ is disabled by the Data Ready signal on line 14. The Data Ready signal from the A/D converter $U_1$ to PROM $U_4$ disables or enables PROM $U_4$. As noted heretofore, the data ready signal is controlled by a clock pulse 12.

An RC network comprised of $R_1$ and $C_1$ coupled to data ready line 14 reduces any transient signals in the circuit generated during the address settling time of the memories and thus avoids triggering incremental changes to the up/down counter $U_7$, $U_8$. The network acts to delay the Data Ready signal to comparator $U_4$ so as to allow data in the circuit to settle before enabling PROM $U_4$ output. The digital stores used in PRO $U_2$-$U_4$ can be a commercially available PROM integrated storage chip such as is used in small or microdigital data processors. In a preferred embodiment, each store comprised an array of 256 four-bit words. Other commercially available RAM integrated storage chips may also be used.

Up/down counters $U_7$ and $U_8$ have the feature of being able to count either down or up. Thus, a number of pulses may be entered during one period and then a second number subtractedd from the first by counting down a predetermined number of pulses. An external clock 32 is selected by NAND gates $U_5$ and $U_6$. Command signals on lines 28 and 30 will change the state of the NAND gates $U_5$ and $U_6$ to increment or decrement the up/down counter $U_7$. Counter $U_7$ and $U_8$ are cascaded by lines 34 and 36. The direction of the count is determined by the clock input which is pulsed while the other clock input is high. Thus, if $U_4$-$D_0$ is low and $U_4$-$D_1$ is low, lines 28 and 30 will both be low, therefore both up and down inputs to $U_7$ will be high, and there will be no change in the count. If $D_0$ is high and $D_1$ is low then the DN input will be held high and the UP input will be pulsed by the clock 32 input, resulting in incrementing the counter. If $D_0$ is low, while $D_1$ is high, then the UP input will be held high, while the DN input will be pulsed, resulting in decrementing the counter. A suitable counter chip is the type CD 40193, available from RCA Solid State Division, Somerville, N.J. 08876.

The four-bit high order field from counter $U_8$ and the four-bit low order field from counter $U_7$ are respectively applied to address PROMs $U_2$ and $U_3$, as heretofore described. The two four-bit fields are combined to form an eight-bit signal which is coupled on the data out bus to the position indicator.

Figures 2, 3:
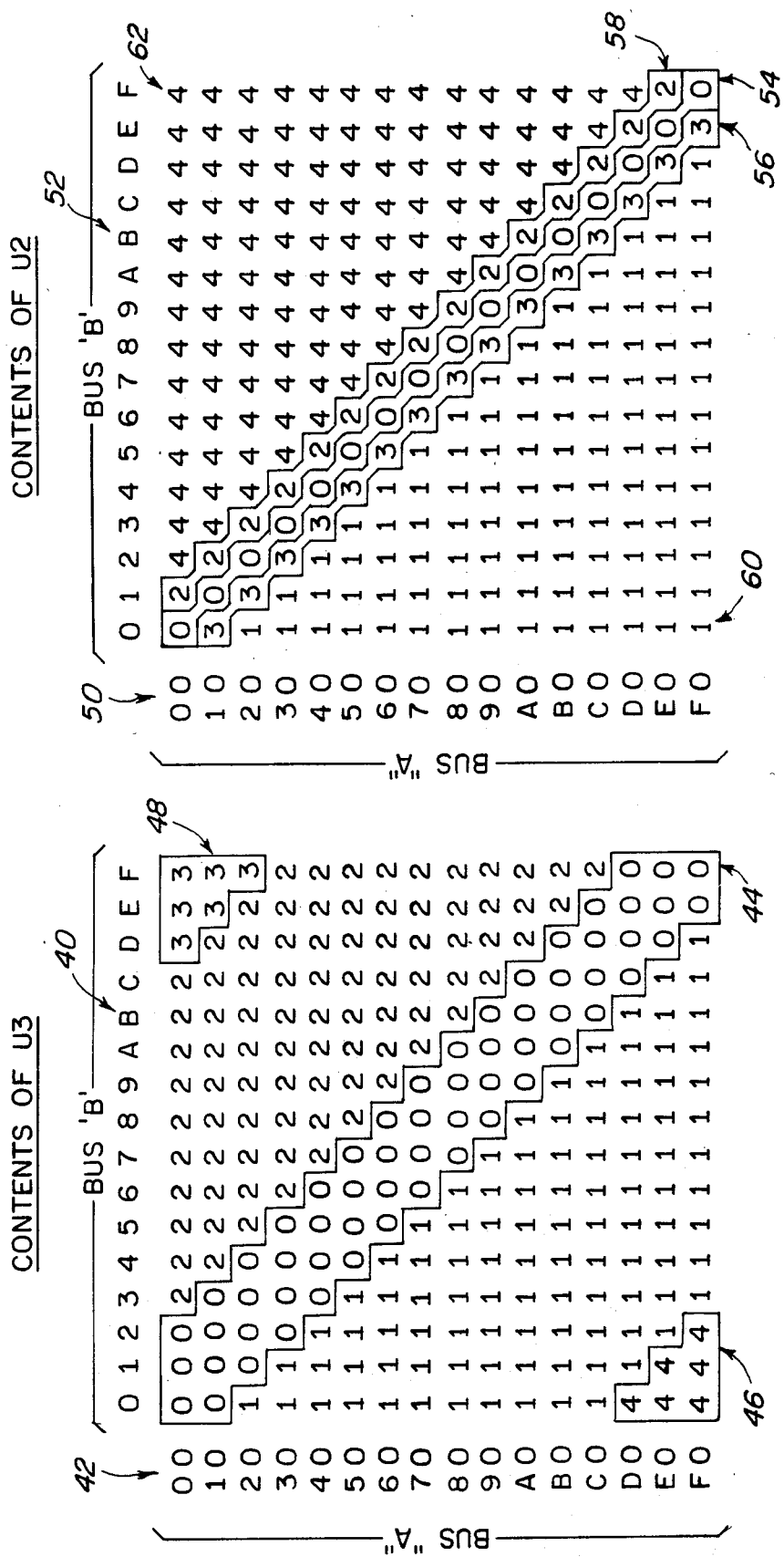
FIG. 2 shows in tabular form the hexadecimal equivalents of the binary words stored in PROM $U_3$ of FIG. 1.
FIG. 3 shows in tabular form the hexadecimal equivalents of the binary words stored in PROM $U_2$ of FIG. 1.

Referring now to FIG. 2, a schematic illustration of the contents of PROM $U_3$ is illustrated. For use as a comparator, PROM $U_3$ is conveniently instrumented as a random access read only memory containing 256 storage locations for 256 four-bit words arranged in a 16 word by 16 word X - Y configuration. Bus A, which operates on the high order addresses $A_4$–$A_7$, is shown along the Y axis, while bus B which operates on the low order addresses $A_0$–$A_3$, is shown along the X axis. In the arrangement shown, the low order address field on bus B, corresponding to line 22, can address 16 column addresses 40 ranging from zero to F, while the low order address field on bus A, corresponding to line 16, can address 16 row addresses 42, also ranging from zero through F.

Each of the four-bit storage locations of the memory $U_3$ containing a 1 or 2 is associated with a predetermined instruction for increasing or decreasing the reference signal from counters $U_7$ and $U_8$. In a manner to be explained, PROM $U_3$ will be addressed by an input binary digital signal from the A/D converter $U_1$ and a reference signal from counter $U_7$ so as to provide an association between these signals. Data stored in the memory $U_3$ provides the required correction to be applied to the data output signal via counter $U_7$.

Any combination of addresses falling within the diagonal area 44 enclosing "0's" will signal that no correction to the digital reference signal is required. For example, if the binary signal on bus A is 0010, corresponding to an address at row 3 (hexadecimal value 2) and the binary signal on bus B is 0011, corresponding to column 4 (hexadecimal value 3), the intersection of these address values falls at a zero value within area 44.

If the address value of bus A is significantly greater than the address value of bus B, than an output of number 1 will result, indicating that the value of the up/down counter should be incrementally increased. For example, if the address value applied to bus A is at row 9 (hexadecimal value 8) and the address value applied to bus B is at column 6 (hexadecimal value 5), the stored value at this address is a 1. Conversely, if the address value at bus A is significantly less than the address value at bus B, then the output word will have a value of 2, indicating that the value of the up/down counter should be incrementally decreased. For example, if the address value at bus A is at row 1 (hexadecimal value 0) and the address value of bus B is at column 4 (hexadecimal value 3), the signal stored at the word addressed has a value of 2.

Addresses falling within the corner areas 46 or 48 signify that a possible boundry condition exists. A boundry condition will exist when the low order comparison in PROM $U_3$ shows a difference near a hexadecimal value of 15, and the high order comparison in PROM $U_2$ shows a difference of 1 in the opposite direction. Due to an ambiguity in the addressing scheme, $U_3$ will signal an increment to the counter while $U_2$ signals a decrement to the counter. If such a boundry condition exists the value of the up/down counter $U_7$ will not be altered. A stored value of 3 or 4 indicates that further evaluation is required to determine whether or not the output data signal will be incremented or decremented, depending upon the output of PROM $U_2$ as will be described. Thus, if bus A is addressed by an input value of hexadecimal 0E while bus B is addressed on input value of hexadecimal 01, the resultant address falls within zone 46 where a value of 4 is stored. Similarly, if the address applied to bus A and bus B falls within zone 48, where a value of 3 is stored, the output data signal may or may not be altered, depending upon the output of PROM $U_2$.

It will be appreciated that the values stored in the memory locations are arbitrary and it is only required that PROM $U_4$ be programmed to accept the values chosen. Any numbers between 0 and 7 may be assigned to the incremental, decremental, or boundary conditions.

The contents of memory $U_2$ are illustrated in FIG. 3, where the coordinates are arranged in a similar fashion to that described above with respect to memory $U_3$. The high order bits $D_0$–$D_3$ from counter $U_8$ are presented on bus 20 to low order input $A_0$–$A_3$ of PROM $U_2$, while the high order bits $D_4$–$D_7$ from A/D converter $U_1$ are coupled to high order input $A_4$–$A_7$ of PROM $U_2$ via bus 18.

If the address on bus A ($A_4$–$A_7$) is identical to the address on bus B ($A_0$–$A_3$), an output of 0, shown by diagonal region 54, will be generated. If bus A is greater by a value of 1 than bus B, the resultant address will fall within zone 56, providing an output of 3. If bus B is greatr than bus A by value of 1, then the resultant address falls within zone 58, with an output of 2. The values of 2 and 3 are assigned to indicate that a possible boundary condition with low order PROM $U_3$ may exist. For all difference values greater than 1, a 1, as in triangular zone 60 extending from address 20 to F0 or a 4, as in triangular zone 62 extending from address 02, to 0F, will be addressed to signal that the up-down counter should be correspondingly incremented or decremented.

Figures 4, 5:
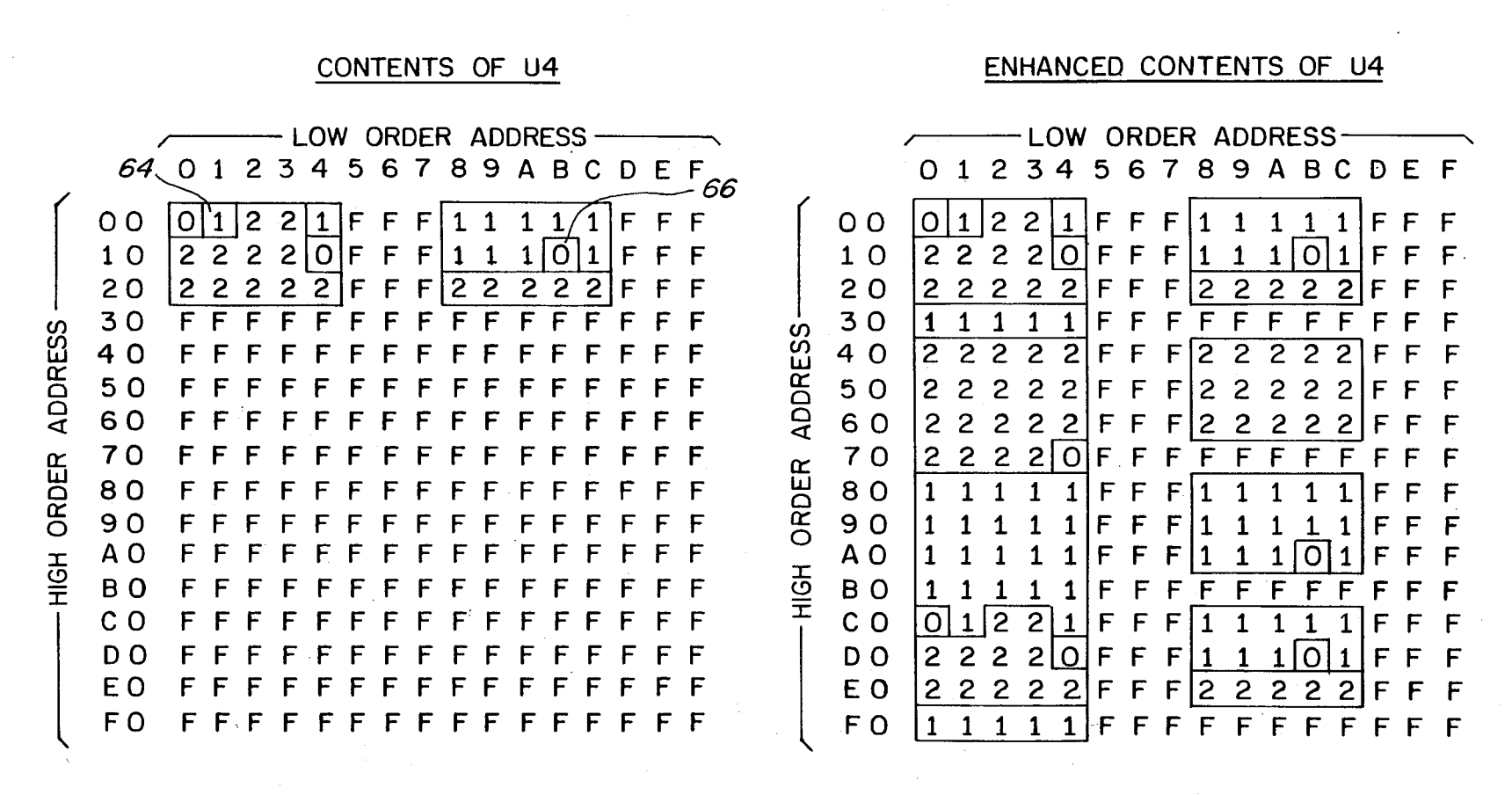

Referring now to FIG. 4, with continued reference to FIG. 1, a typical data table for PROM $U_4$ is shown. $U_4$ is arranged as a look-up table which determines whether the up/down counter $U_7$, $U_8$ should be incremented, decremented or left unchanged. The table is arranged so that the counter is adjusted only when the addresses of the input binary digital signal and the reference digital signal differ by more than the predetermined hysteresis factor. The hysteresis factor is typically a value of 2. Further, provision is made not to increment or decrement the counter for the boundary conditions described earlier.

PROM $U_4$ receives the outputs of PROM $U_2$ on bus 26 and the outputs of PROM $U_3$ on bus 24 to address a particular location in memory. For example, if $U_2$ outputs binary 000 and $U_3$ outputs binary 001, the addressed location 64 is hexadecimal 01, and the value stored at that address is a 1, which makes output $D_0$ high and $D_1$ low, and results in incrmenting the counter.

If $U_2$ outputs 011 and $U_3$ outputs 011, the addressed location 66 is binary 00011011, or 1B H (hexadecimal). This falls on a 0 at location 66, and results no change in the up/down counter.

Similarly, if an address falls at a location which has a stored value of 2, D0 will be low and D1 will be high, resulting in decrementing the counter.

The unassigned areas of PROM $U_4$ are labelled with hexadecimal value F.

Additional inputs to PROM $U_4$ may be used for nine-bit applications by addressing bits A6, A7. This would permit using a greater word length for higher resolution or greater range without requiring an additional comparator for a ninth pair of bits. The system shown in FIG. 1 permits expansion to 9-bit operation without recourse to a third primary comparator by enabling a ninth bit from the A/D converter $U_1$ to be connectedd to PROM $U_4$ at $A_7$, and a ninth bit from Up/Down counter $U_7$, $U_8$ to be connected to PROM $U_4$ at $A_6$. The additional data bits permit addressing additional words stored in PROM $U_4$ in the manner previously described, as shown in FIG. 5. As in the previous configuration of FIG. 4, unused words are represented by an F, and values 0, 1, 2 represent no change, increment, and decrement of the Up/Down counter, respectively.

Operation of the invention will now be described with reference to FIG. 1, with FIGS. 2, 3, and 4 illustrating typical operational values stored in memory.

Considering first the operation of A/D converter $U_1$, which as heretofore described forms no part of the present invention, an analog signal 10, which may be contaminated by noise, jitter and threshold uncertainty, is applied to converter $U_1$. A timing signal from a clock source 12, also not part of the present invention, is also applied to the converter. Converter $U_1$ generates an eight-bit (or greater) word having a low order four-bit field and a high order four-bit field. The low order four-bit field is applied on bus 16 to high order address inputs $A_4$–$A_7$ of PROM $U_3$, and the high order bit field on bus 18 is applied to high order address inputs $A_4$–$A_7$ of PROM $U_2$.

The up/down counter comprised of cascaded counters $U_7$ and $U_8$ generates a digital reference signal on bus B which comprises an eight-bit (or greater) word having low and high order four-bit fields. The four-bit low order field generated by counter $U_7$ is applied on bus 22 to addresses $A_0$–$A_3$ of PROM $U_3$. The high order four-bit field generated by counter $U_8$ is applied on bus 20 to the low order addresses $A_0$–$A_3$ of PROM $U_2$. Buses 20 and 22 comprise an eight-bit bus B which provides an eight-bit data output signal to a readout indicator. It may be seen therefore that the outputs of converter $U_1$ and counter $U_7$, $U_8$ are divided in such a manner as to provide an eight-bit address to PROMs $U_2$ and $U_3$. Thus, PROMs $U_2$ and $U_3$ are each capable of addressing 256 locations.

While the analog data 10 at converter $U_1$ may vary in a random or periodic fashion notwithstanding that there has been no change in the true value of data generated by the remote source, the value of the output data on bus B will be stabilized, and will be incrementally increased or incrementally decreased only when the difference between the signal values on bus A and bus B exceeds the predetermined hysteresis value. The incremental changes in the value of the output data on bus B are commanded by signals on lines 28 and 30 which change the state of NAND gates $U_5$ and $U_6$, which allows the external clock signal 32 to increment or decrement counter $U_7$, $U_8$. The conversion clock signal 12 is set at a rate of approximately one tenth the rate of counter clock signal 32, which permits the up/down counter to slew approximately ten steps on each data conversion cycle of the A/D converter $U_1$. For a clock 32 rate of 1 KHz and an eight-bit output signal, approximately 0.3 seconds will be required to slew the output signal from 00 to FF. If a faster response time is required, the counter clock rate must be increased. If two-speed slewing is desired, then PROM $U_4$ can be arranged in a conventional manner to generate a quick/slow bit which will control the clock speed and thereby control the counter slewing speed.

As seen in FIG. 1, the low order bit field $D_0$–$D_3$ of the digital signal on bus 16 is compared with the low order bit field counter signal $D_0$–$D_3$ on bus 22 in PROM $U_3$. Each four-bit address permits addressing 16 rows or columns. From the look-up table previously described with respect to FIG. 2, it may be seen that PROM $U_3$ will act as a comparator, providing a unique output word responsive to an eight-bit address. In effect, the magnitudes of each four-bit field are compared in PROM $U_3$, and a three-bit output command provided which corresponds to the input addresses and which directs the counter through PROM $U_4$ to be incremented or decremented accordingly. The hysteresis feature is apparent from consideration of zone 44, wherein it may be seen that perturbations within a range of about two digits will not result in a change in the indicated output.

Similarly, the high order bits $D_4$–$D_7$ from the A/D converter $U_1$ and $D_0$–$D_3$ from counter $U_8$ are applied to PROM $U_2$ for generation of further command instructions to PROM $U_4$. From FIG. 3, it may be noted that the hysteresis region includes a narrow field 54 wherein no change in data output is commanded, circumscribed by further boundary fields 56 and 58 which are subject to further evaluation in PROM $U_4$ for a determination as whether a counter command shall be implemented. Thus, considerable flexibility is provided to the designer in tailoring the response of the hysteresis system to the characteristics of the signal source 10 and the display indicator.

The low order three-bit field on bus 24 and the high order three-bit field on bus 26 form a six-bit field capable of addressing 64 memory locations of PROM $U_4$. The memory locations are organized to define counter increment, counter decrement, and no change signal commands, corresponding to binary outputs of 10, 01, and 00 at terminals $D_0$, $D_1$.

Assume for example, an analog input signal 10 of 1.35 volts peak, applied to converter $U_1$. The digital output $D_0$–$D_7$ may be scaled and represented as 10000111. Therefore the high order signal on bus 18 is 1000 and the low order signal on bus 16 is 0111. Assuming the system is stabilized, the same signal will appear on the data output bus, hence the high order signal on bus 20 will be 1000 and the low order signal on bus 22 will be 0111. Digital address 1000 1000, obtained by combining the high bit signals on buses 18 and 20, has a hexadecimal value of 88H. Referring to FIG. 3, the memory contents of PROM $U_2$ at address 88H has a value of 0. Thus, the digital output of PROM $U_2$ provided to bits $A_3$–$A_5$ of $U_4$ is 000. Likewise, referring to FIG. 2, the digital address on buses 16 and 22 results in a hexadecimal address of 77H to PROM $U_3$, and a digital output value of 000 to PROM $U_4$ at bits $A_0$–$A_2$. The resultant hexadecimal signal input to PROM $U_4$ is 00, which also results in a digital 0 output of $D_0$ and $D_1$. With one input of each NAND gate $U_5$ and $U_6$ held low, both UP and DN inputs to counter $U_7$ are held high, resulting in no change in value of the counter. Therefore, the data output signal remains clamped at the same level as value as the digital signal from converter $U_1$. It may be seen that any noise or jitter on the input signal will not produce a response, so long as the resultant signal falls within the "0" or hysteresis zone.

Consider now that the analog signal is representative of the position of a movable control, and that a change in position results in an analog signal 10 of 1.40 volts peak. The binary output on bus A has a value of 10001100, or a hexadecimal value of 8CH. The counter has stabilized at the previous antenna position corresponding to an analog value of 1.35 volts peak, and from the foregoing example, the resultant low order signal to PROM $U_3$ is 0111 on bus 22 and 1100 on bus 16, which is equivalent to C7H and produces a binary 1 output on bus 24, which tends to increment counter $U_7$, $U_8$.

The resultant high order signal to PROM $U_2$ is again 1000 on bus 20 and a value of 1000 on bus 18. Consulting FIG. 3 for the table stored in memory $U_2$, one finds at address 88, equivalent to binary 1000 1000 a value of 0, indicating no change in counter $U_7$, $U_8$.

The resultant digital address to PROM $U_4$ is obtained by adding the high and low order digital signals from PROM $U_3$ and $U_2$, respectively, and results in a value of 000001. Since a six bit address is provided, it must be grouped in the form 0000 0001 to obtain the hexadecimal address 01 applied to PROM $U_4$. Consulting FIG. 4, the address falls at zone 64, and results in a 1 output, which causes the up-down counter to increment. If PROMS $U_2$ and $U_3$ address locations within PROM $U_4$ *having a value of* 1, such as sector 64, output $D_0$ will be high, energizing line 28. Since the 0 output on $D_1$ holds gate $U_6$ high, gate $U_5$ is enabled by the clock 32 to pulse the UP terminal of counter $U_7$, $U_8$ thus causing an incremental increase in the value of the output data signal on bus B.

The counter will continue to increment until the data output values on bus B agree with the digital input values on bus A, thereby causing the digital display coupled to the data output bus to increment until the new antenna position is correctly indicated.

If $U_4$ is addressed to a location having a digital value of 2, output $D_1$ will be activated thereby holding gate $U_5$ high, and causing gate $U_6$ to transmit clock 32 pulses to decrement counter $U_7$, $U_8$. Where $U_4$ is addressed in locations having a value of 0, both $D_0$ and $D_1$ will be held low, thereby clamping the outputs of gates $U_5$ and $U_6$ high, resulting in no change in value to the data output signal.

In a similar manner, it may be shown that a reversal of the control position will result in decrementing the counter to match the reduced analog input signal, so that the system will track the control position signal continuously, while providing a predetermined range of hysteresis values within which a transient indication of transient indication of change in position will be suppressed.

There results a small, unnoticable error in the digital position indication, due to the hysteresis programmed into the system and the time required for the clock to address all the memory locations. However, the resolution of the present invention is sufficiently fine that an operator would not be aware that the indicator is not simultaneously tracking a change in control position.

While the invention has been described in its preferred embodiments, it is to be understood that the words which have been used are words of description rather than limitation and that changes may be made within the purview of the appended claims without departing from the true scope and spirit of the invention in its broader aspects.

What is claimed is:

1. Digital control apparatus for stabilizing the value of an input digital signal having error components superposed thereon by interposing a predetermined value of hysteresis, comprising:

data output means for generating a reference digital signal for energizing a digital display, digital data store means for storing correction factor signals in binary form representative of differences between said input digital signal and said reference digital signal for differences that exceed said predetermined value of hysteresis and for storing a quiescent command representative of no change in said reference digital signal for differences that do not exceed said predetermined value of hysteresis, means to apply said input digital signal and said reference digital signal to said digital data store means, means for reading out said correction factor signals from said digital data store means corresponding to said applied signals, and means for applying said correction factor signals to said data output means so as to increment or decrement said output means in a direction to reduce differences between said input digital signal and said reference digital signal when said differences exceed said predetermined value of hysteresis and for applying said quiescent command to said data output means so as to effect no change in said reference digital signal when said differences do not exceed said predetermined value of hysteresis.

2. Apparatus as set forth in claim 1, said data output means further comprising up/down counting means for incrementing and decrementing said reference digital signal in accordance with said correction factor signals, thereby reducing said difference to within said predetermined value of hysteresis.

3. Apparatus as set forth in claim 2, further comprising logic means responsive to said correction factor signals and to a source of clock pulses for periodically sampling and correcting said counter means in accordance therewith.

4. Apparatus as set forth in claim 3, wherein said logic means includes NAND gate means.

5. Apparatus as set forth in claim 1, wherein said digital data store means includes addressable memory means comprising a predetermined array of binary digital words corresponding to predetermined values of said differences.

6. Apparatus as set forth in claim 5, wherein said memory means includes a programmable read only memory.

7. Apparatus as set forth in claim 6, wherein said digital data store means comprises a plurality of storage locations corresponding respectively to a plurality of differences between said input digital signal and said reference digital signal, and each storage location contains a binary word defining a difference value corresponding to a correction factor to be applied to said data output means.

8. Apparatus as set forth in claim 7, wherein said digital data store means comprises;

means for receiving parallel input groups of binary digital signals, means for providing parallel output groups of binary digital signals corresponding to said input groups, said input digital signal and said reference digital signal each comprising high order and low order groups of said parallel input signals, said means to apply said input digital signal and said reference digital signal to said digital data store means including means for combining a high order group of said reference digital signal and a high order group of said binary digital signal, means for applying said combined high order groups of reference digital signal and binary digital signal to a first digital data store means, said means to apply said input digital signal and said reference digital signal further including means for combining a low order group of said reference digital signal and a low order group of said binary digital signal, means for applying said combined low order groups of reference digital signal and binary digital signal to a second digital store means.

said first and second digital data store means respectively adapted to provide a further high order and low order groups of binary digital signals to a third digital data store means, said third digital data store means providing command signals responsive to said differences to said up/down counting means.

9. Apparatus as set forth in claim 8, wherein said digital data store means comprises at least three components, including locations representing an increment command, a decrement command, and said quiescent command.

10. Apparatus as set forth in claim 9, further comprising a fourth component having a location representing a boundary condition which is indeterminate of a command condition.

* * * * *